United States Patent
Wada et al.

(10) Patent No.: US 11,190,671 B2
(45) Date of Patent: Nov. 30, 2021

(54) IMAGING APPARATUS

(71) Applicant: Panasonic Intellectual Property Management Co., Ltd., Osaka (JP)

(72) Inventors: Rintaro Wada, Osaka (JP); Yuji Tominaga, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 16/738,169

(22) Filed: Jan. 9, 2020

(65) Prior Publication Data

US 2020/0344922 A1 Oct. 29, 2020

(30) Foreign Application Priority Data

Apr. 23, 2019 (WO) .................. PCT/JP2019/017174
Sep. 3, 2019 (JP) ................................ 2019-160545

(51) Int. Cl.
*H04N 5/225* (2006.01)
*H05K 7/20* (2006.01)

(52) U.S. Cl.
CPC ....... *H04N 5/22521* (2018.08); *H04N 5/2252* (2013.01); *H04N 5/225251* (2018.08); *H05K 7/20154* (2013.01); *H05K 7/20172* (2013.01); *H05K 7/20972* (2013.01)

(58) Field of Classification Search
CPC ............ H04N 5/22521; H04N 5/2252; H04N 5/225251; H05K 7/20172; H05K 7/20154; H05K 7/20972
See application file for complete search history.

(56) References Cited

U.S. PATENT DOCUMENTS

| 2009/0002549 | A1 | 1/2009 | Kobayashi | |
|---|---|---|---|---|
| 2009/0244363 | A1* | 10/2009 | Sugimura | H04N 5/232 348/374 |
| 2017/0261840 | A1 | 9/2017 | Yoneda | |
| 2017/0347034 | A1* | 11/2017 | Iwasaki | G03B 17/04 |
| 2018/0107099 | A1 | 4/2018 | Yasuda | |

(Continued)

FOREIGN PATENT DOCUMENTS

| JP | 2009-033547 A | 2/2009 |
|---|---|---|
| JP | 2009-033718 A | 2/2009 |

(Continued)

OTHER PUBLICATIONS

International Search Report for corresponding Application No. PCT/JP2019/017174, dated Jun. 18, 2019.

*Primary Examiner* — Timothy J Henn
(74) *Attorney, Agent, or Firm* — Renner, Otto, Boisselle & Sklar, LLP

(57) ABSTRACT

An imaging apparatus includes a casing having an inlet port and an exhaust port, at least one heat source that is disposed in the casing and includes at least an image sensor, a fan that is disposed in the casing, takes in outside air through an inlet port, and blows out the taken-in outside air toward the exhaust port, and a display panel unit that includes a display panel and is rotatably provided on a rear surface of the casing. The inlet port includes first and second inlet ports that open in different directions. When viewed in a facing direction between the display panel unit in a housed state and the casing, the entire second inlet port is provided in a portion of the casing covered by the display panel unit in the housed state.

12 Claims, 14 Drawing Sheets

(56) References Cited

U.S. PATENT DOCUMENTS

| | | | |
|---|---|---|---|
| 2018/0278814 A1 | 9/2018 | Yamamoto | |
| 2019/0385927 A1* | 12/2019 | Shibata | ............... H01L 23/4006 |
| 2020/0275584 A1* | 8/2020 | Chiang | .............. H05K 7/20736 |

FOREIGN PATENT DOCUMENTS

| | | |
|---|---|---|
| JP | 2009-246884 A | 10/2009 |
| JP | 2015-171122 A | 9/2015 |
| JP | 2016-122083 A | 7/2016 |
| JP | 2016-134813 A | 7/2016 |
| JP | 2018-067901 A | 4/2018 |
| JP | 2018-164250 A | 10/2018 |
| JP | 2018-191022 A | 11/2018 |
| JP | 2018-196071 A | 12/2018 |
| WO | 2016/031369 A1 | 3/2016 |
| WO | 2019/061096 A1 | 4/2019 |

* cited by examiner

IMAGING APPARATUS

BACKGROUND OF THE INVENTION

Field of the Invention

The present disclosure relates to an imaging apparatus.

Description of the Related Art

Japanese Unexamined Patent Application Publication No. 2018-67901 discloses an imaging apparatus having a casing, an electronic component, such as an image sensor mounted in the casing, and a heat dissipation frame that is provided in the casing and transmits heat generated from the electronic component to the casing.

In recent years, there has been a demand for an imaging apparatus capable of executing high-load processing, such as shooting and processing high-quality moving images. However, the higher the processing load, the more heat is generated from an electronic component, such as an image sensor. For this reason, the imaging apparatus needs to radiate the heat generated from the electronic component more efficiently to the outside of the casing.

SUMMARY OF THE INVENTION

In view of the above, an object of the present disclosure is to improve the heat dissipation performance of an imaging apparatus.

According to an aspect of the present disclosure, there is provided an imaging apparatus including:

a casing having an inlet port and an exhaust port;

at least one heat source disposed in the casing and including at least an image sensor;

a fan that is disposed in the casing, takes in outside air through the inlet port, and blows out the taken-in outside air toward the exhaust port; and a display panel unit including a display panel and rotatably provided on the casing.

The inlet port includes first and second inlet ports, and the entire second inlet port is provided in a portion of the casing that is covered by the display panel unit in a housed state when viewed in a facing direction between the display panel unit in the housed state and the casing.

Further, according to another aspect of the present disclosure, there is provided an imaging apparatus including:

a casing having an inlet port and an exhaust port;

at least one heat source disposed in the casing and including at least an image sensor;

a fan that is disposed in the casing, takes in outside air through the inlet port, and blows out the taken-in outside air toward the exhaust port; and an operation unit provided on a rear surface of the casing.

The rear surface of the casing has a raised portion formed by raising of a portion adjacent to the operation unit, the inlet port includes first and second inlet ports opening in different directions, and at least the second inlet port of the first and second inlet ports is provided on the raised portion.

Furthermore, according to a different aspect of the present disclosure, there is provided an imaging apparatus including:

a casing having an inlet port and an exhaust port;

at least one heat source disposed in the casing and including at least an image sensor;

a fan that is disposed in the casing, takes in outside air through the inletport, and blows out the taken-in outside air toward the exhaust port; and an operation unit provided on a rear surface of the casing.

The rear surface of the casing has a depressed portion formed by depression of a portion adjacent to the operation unit, the inlet port includes first and second inlet ports opening in different directions, and at least the second inlet port of the first and second inlet ports is provided on the depressed portion.

According to the present disclosure, the heat dissipation performance of an imaging apparatus can be improved.

DESCRIPTION OF THE PREFERRED EMBODIMENTS

Hereinafter, embodiments will be described in detail with reference to the drawings as appropriate. However, the description that is detailed more than necessary may be omitted. For example, detailed description of an already well-known matter and redundant description of substantially the same configuration may be omitted. This is to avoid unnecessary redundancy in the description below and to facilitate understanding of those skilled in the art.

Note that the inventor(s) provide the accompanying drawings and the description below so that those skilled in the art can fully understand the present disclosure, and do not intend to limit the subject matter described in claims by these drawings and description.

Hereinafter, an imaging apparatus according to a plurality of embodiments of the present disclosure will be described with reference to FIGS. 1 to 10.

First Embodiment

Figure 1:
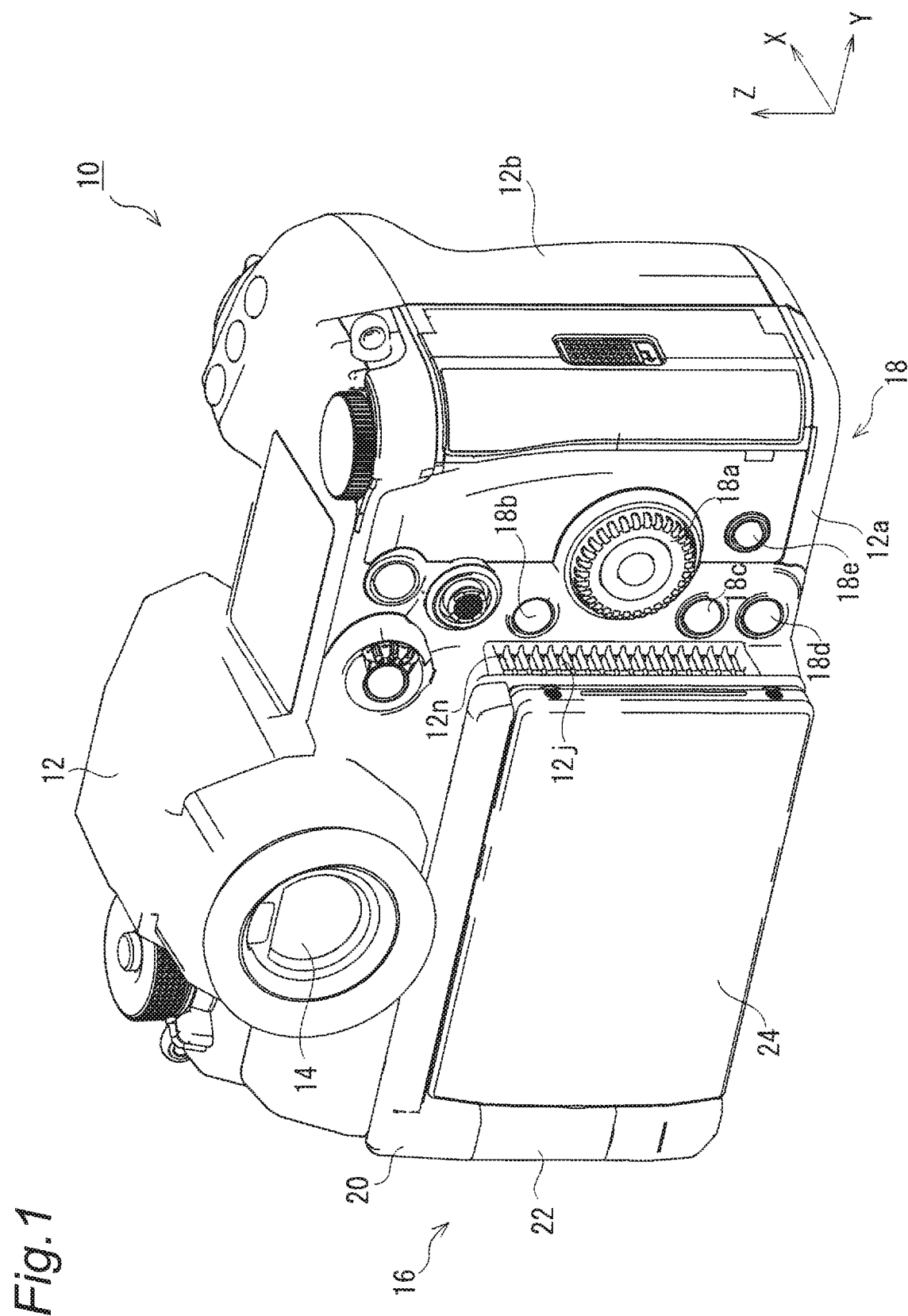
FIG. 1 is a left rear perspective view of an imaging apparatus according to a first embodiment of the present disclosure in a state in which a display panel unit is housed.
Figure 2:
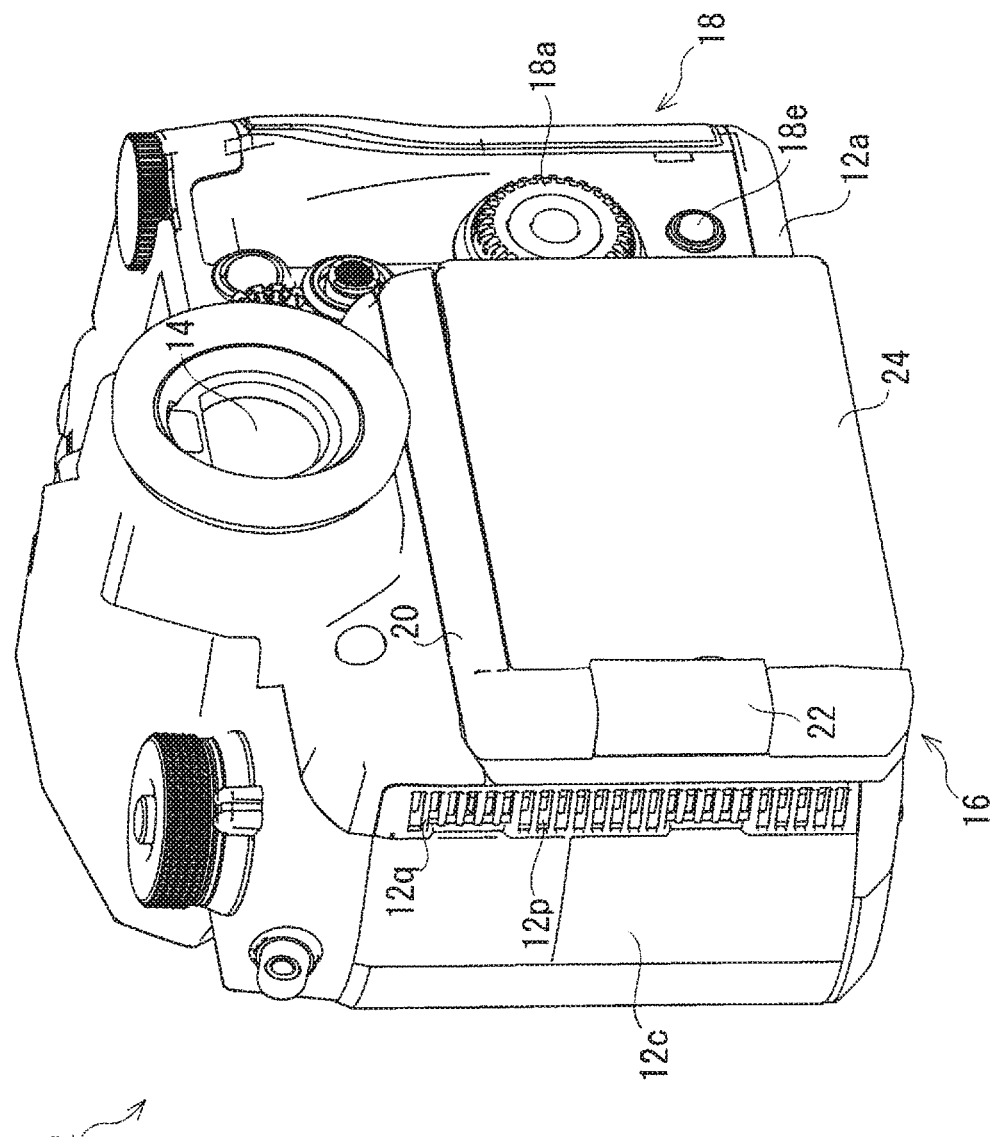
FIG. 2 is a right rear perspective view of the imaging apparatus in a state in which the display panel unit is housed.
Figure 3:
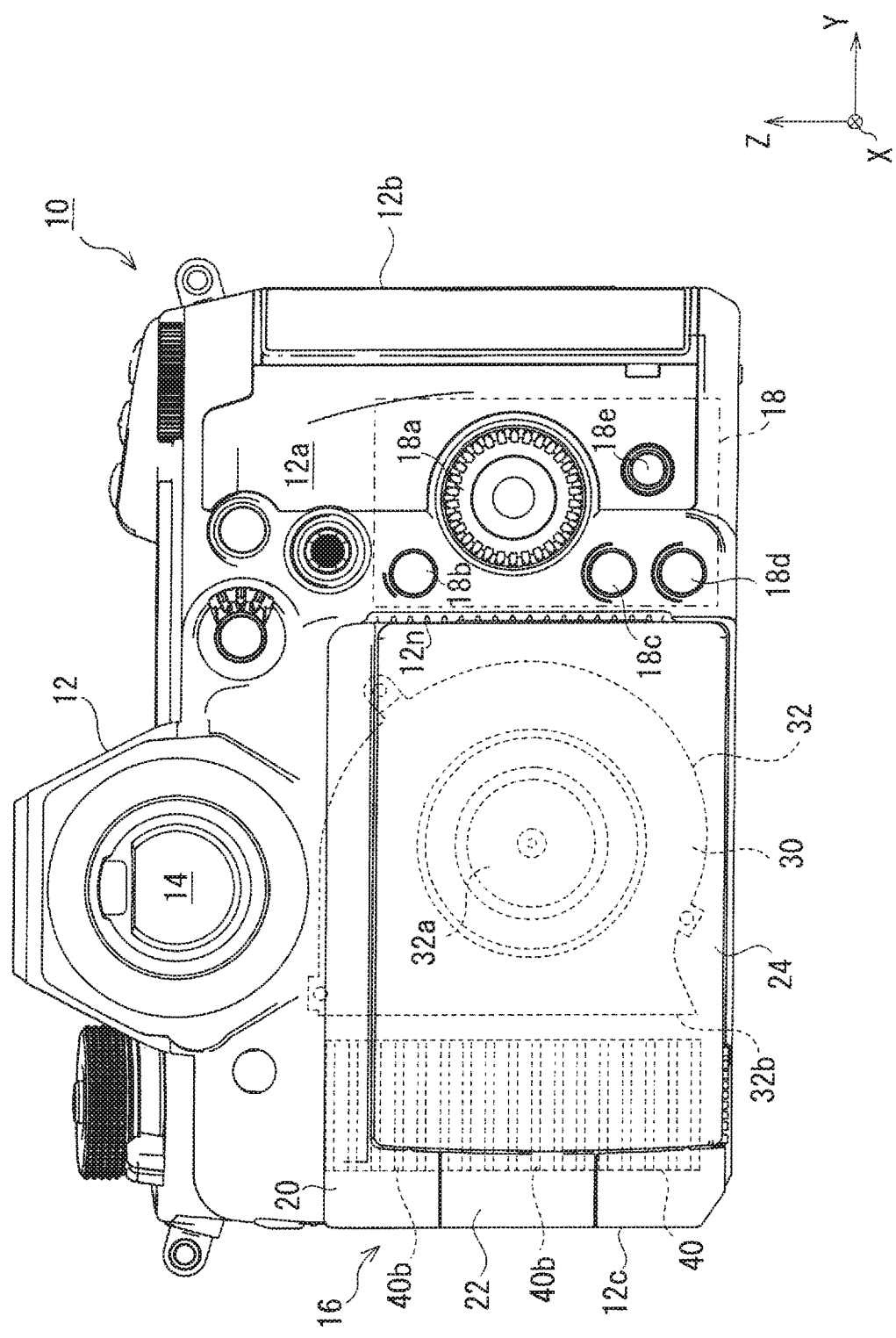
FIG. 3 is a rear view of the imaging apparatus in a state in which the display panel unit is housed.

FIG. 1 is a left rear perspective view of an imaging apparatus according to a first embodiment, FIG. 2 is a right rear perspective view of the imaging apparatus, and FIG. 3 is a rear view of the imaging apparatus. Note that an XYZ coordinate system shown in the drawings is for facilitating understanding of the embodiments of the present disclosure, and not for limiting the invention. An X axis indicates a front-rear direction of the imaging apparatus, a Y axis indicates a left-right direction, and a Z axis indicates a vertical direction. Further, "left" and "right" are based on a case where the imaging apparatus is viewed from the front (a lens barrel side).

As shown in FIGS. 1 to 3, the imaging apparatus 10 according to the first embodiment is what is called a camera, and includes a casing 12. FIG. 1 shows a rear surface 12a and a left side surface 12b of the casing 12. FIG. 2 shows the rear surface 12a and a right side surface 12c of the casing 12.

As shown in FIGS. 1 to 3, in the first embodiment, a finder 14 is provided in an upper portion of the rear surface 12a of the casing 12, a display panel unit 16 is provided on one side (the right side surface 12c side) in the left-right direction (Y-axis direction), and an operation unit 18 including a plurality of operation buttons 18a to 18e are provided on the other side (left side surface 12b side).

The display panel unit 16 is provided so as to be rotatable with respect to the casing 12 (the rear surface 12a of the casing 12).

Figure 4:
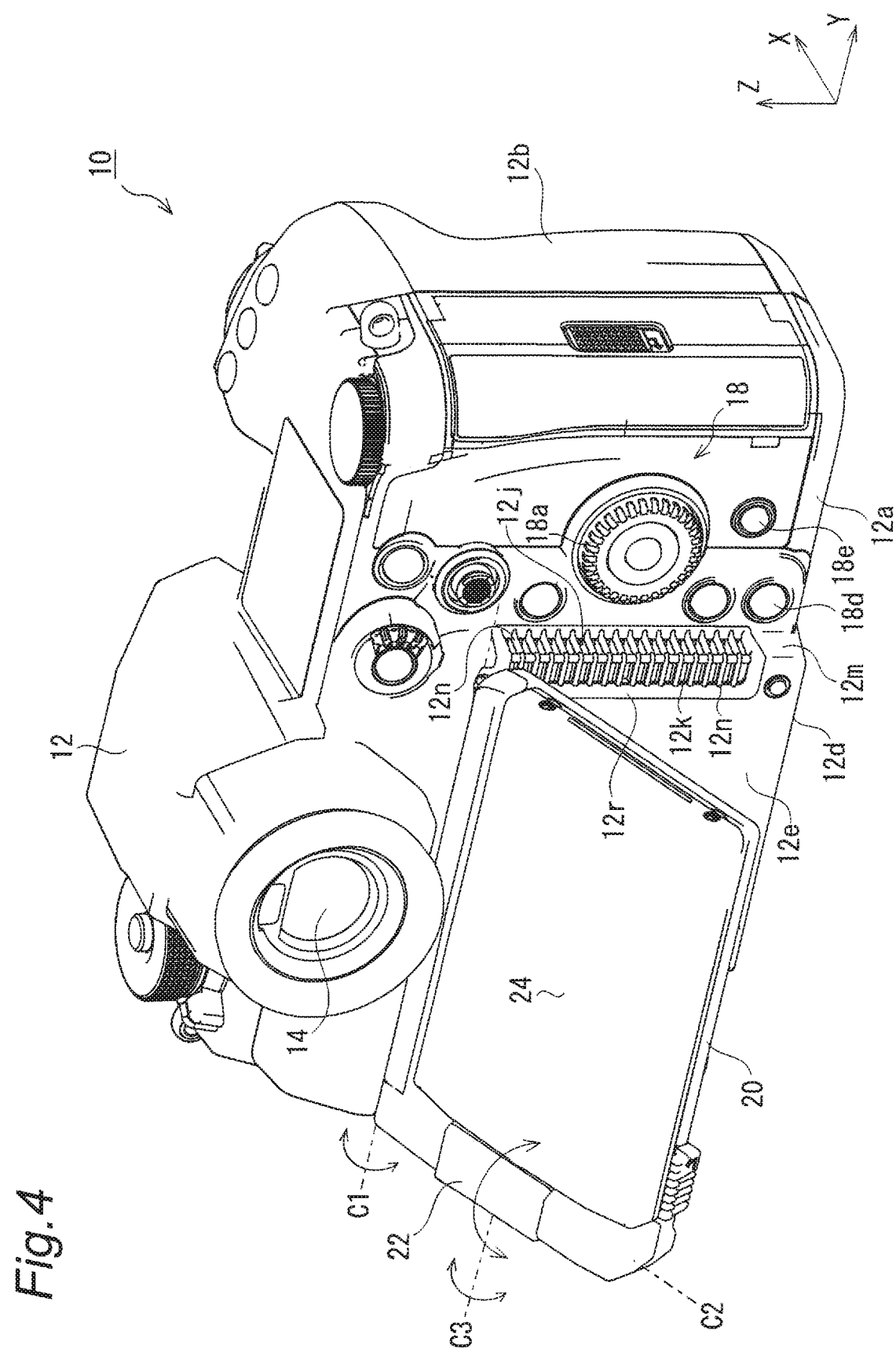
FIG. 4 is a left rear perspective view of the imaging apparatus in a state in which the display panel unit is rotated from a housed position.
Figure 5:
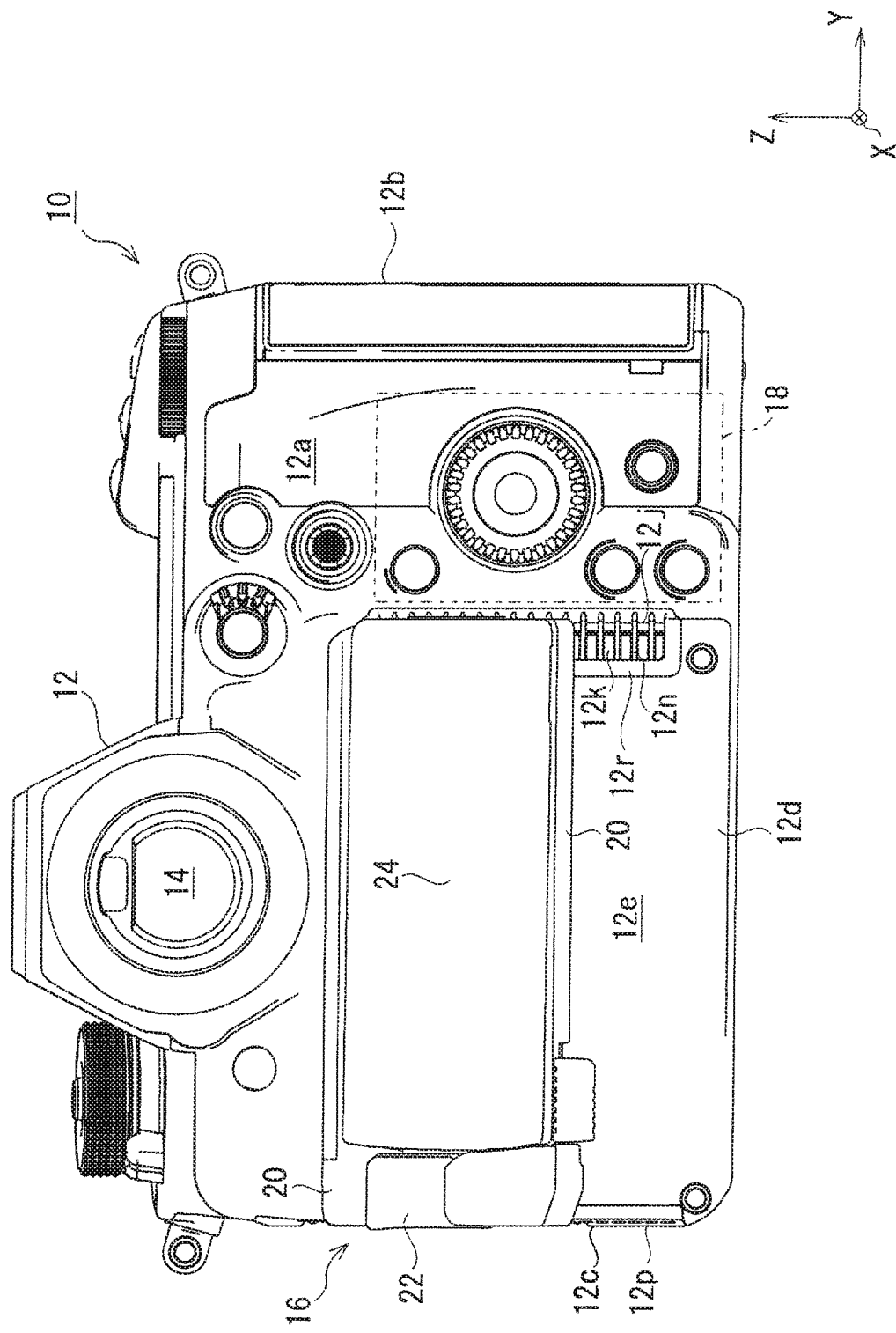
FIG. 5 is a rear view of the imaging apparatus in a state in which the display panel unit is rotated from the housed position.

FIG. 4 is a left rear perspective view of the imaging apparatus showing a state in which the display panel unit is rotated from the housed position, and FIG. 5 is a rear view of the imaging apparatus showing a state in which the display panel unit is rotated from the housed position. Note that FIGS. 4 and 5 show the same state of the imaging apparatus 10, that is, a state in which the display panel unit 16 is inclined at an angle of 60 degrees with respect to the rear surface of the imaging apparatus 10, only in different viewpoints. Further, FIGS. 1 to 3 show the imaging apparatus in a state where the display panel unit is housed at the housed position.

As shown in FIG. 4, in the first embodiment, the display panel unit 16 includes a rotation base 20 whose upper end is rotatably attached to the casing 12, a hinge 22 that is rotatably attached to the rotation base 20, and a display panel 24 that is rotatably attached to the hinge 22.

Specifically, the rotation base 20 of the display panel unit 16 has an upper end supported by the casing 12 so as to be rotatable about a first rotation center line C1 extending in the left-right direction (Y-axis direction). The hinge 22 is supported by a portion on the right side surface 12c side of the casing 12 in the rotation base 20 so as to be rotatable about a second rotation center line C2 extending in a direction orthogonal to the first rotation center line C1. Note that, as shown in FIGS. 1 and 2, when the display panel unit 16 is located at the housed position (when the entire display panel unit 16 is closest to the casing 12), the second rotation center line C2 extends in the vertical direction (Z-axis direction).

The display panel 24 is, for example, a liquid crystal panel, and displays, for example, captured images and moving images. The display panel 24 may be a touch screen display.

The display panel 24 is supported by the hinge 22 of the display panel unit 16 so as to be rotatable about a third rotation center line C3 parallel to the first rotation center line C1.

As shown in FIG. 3, a fan 30 is built in the casing 12 of the imaging apparatus 10.

Figure 6:
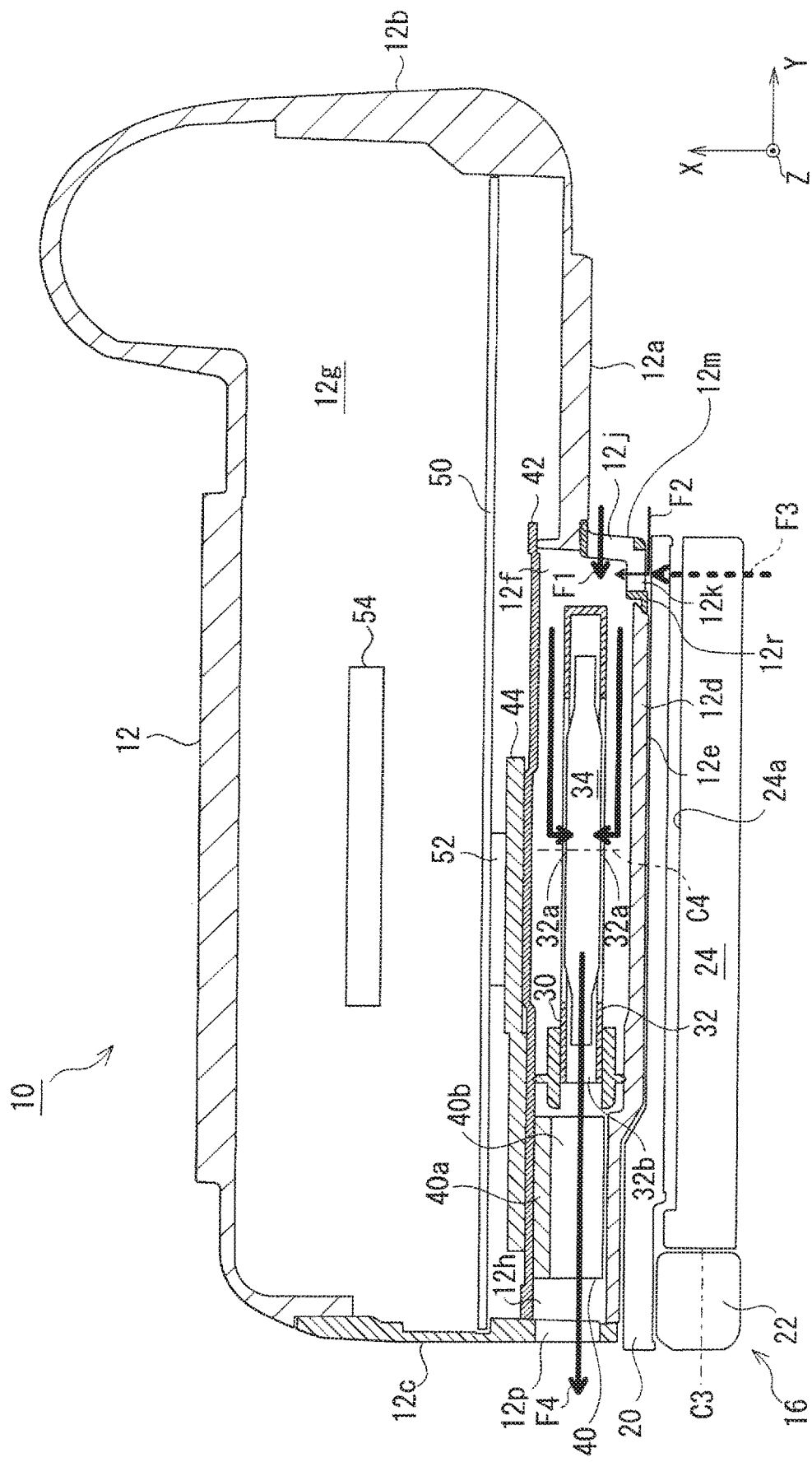
FIG. 6 is a top sectional view of the imaging apparatus.

FIG. 6 is a top sectional view of the imaging apparatus according to the present first embodiment.

As shown in FIG. 6, the fan 30 is disposed in the casing 12 of the imaging apparatus 10. In the first embodiment, the fan 30 is a sirocco fan including a fan case 32 having air intake ports 32a and an air outlet port 32b, and an impeller 34 accommodated in the fan case 32.

The fan 30 that is a sirocco fan is configured to take in air in an extending direction of a rotation center line C4 of the impeller 34 and blow out air in one direction orthogonal to the rotation center line C4. The fan 30 is disposed in the casing 12 so that the extending direction of the rotation center line C4 of the impeller 34 is parallel to the front-rear direction (X-axis direction). That is, the air intake ports 32a provided in the fan case 32 opens in the front-rear direction, and the air outlet port 32b opens in the left-right direction (Y-axis direction). In the first embodiment, the air outlet port 32b faces the right side surface 12c of the casing 12.

With respect to the disposed position of the fan 30, as shown in FIG. 4, in the first embodiment, the rear surface 12a of the casing 12 includes a raised portion 12d formed by raising of a portion adjacent to an operation unit 18. In the first embodiment, the operation unit 18 and the raised portion 12d are provided on the rear surface 12a side by side in the left-right direction (Y-axis direction).

The raised portion 12d is plateau-shaped and includes a flat top surface 12e. As shown in FIG. 6, the fan 30 is disposed in the raised portion 12d. Note that, as shown in FIG. 6, the top surface 12e of the raised portion 12d is covered by the display panel unit 16 when the display panel unit 16 is located at the housed position.

Note that, as shown in FIG. 6, in the case of the present first embodiment, the fan 30 is housed in fan housing space 12f defined in the casing 12. Specifically, the casing 12 is partitioned into main space 12g, the fan housing space 12f, and heat sink housing space 12h, which will be described later in detail. Note that the main space 12g houses an electronic component, such as an image sensor (not shown) that captures images and moving images.

The fan housing space 12f is defined so that part of the fan housing space 12f exists in the raised portion 12d of the casing 12. The fan 30 including the air intake ports 32a is housed in the fan housing space 12f. The air outlet port 32b of the fan 30 communicates with the heat sink housing space 12h.

In order to suck air (outside air) into the fan housing space 12f via the fan 30, the casing 12 includes a first inlet port 12j and a second inlet port 12k as shown in FIG. 4. In the first embodiment, the first inlet port 12j and the second inlet port 12k are disposed in the vicinity of the outer periphery of the display panel unit 16. The first inlet port 12j and the second inlet port 12k are opened in different directions, and are therefore provided in different portions of the casing 12.

Specifically, as shown in FIGS. 4 and 6, in the first embodiment, the first inlet port 12j is provided on a side surface 12m on the operation unit 18 side of the plateau-shaped raised portion 12d, and opens toward the left of the casing 12. The second inlet port 12k is provided on the top surface 12e of the plateau-shaped raised portion 12d so as to be adjacent to the first inlet port 12j, and opens toward the rear of the casing 12. Therefore, the opening direction of the first inlet port 12j and the opening direction of the second inlet port 12k are different by about 90 degrees.

Note that a guard frame 12n is provided in the first and second inlet ports 12j and 12k in order to suppress the entry of a foreign matter.

Further, as shown in FIG. 6, since the second inlet port 12k is provided on the top surface 12e of the raised portion 12d, when the display panel unit 16 is positioned at the housed position, the entire second inlet port 12k is covered by the display panel unit 16. Specifically, when viewed in a facing direction between the display panel unit 16 in the housed state and the casing 12 (the X-axis direction view), the entire second inlet port 12k is provided in a portion of the top surface 12e of the raised portion 12d covered by the display panel unit 16 in the above state. A gap is provided between a peripheral portion of the second inlet port 12k and the display panel unit 16 so that air can enter the second inlet port 12k even in the covered state. For example, a portion 12r of the top surface 12e, which is a peripheral portion of the second inlet port 12k, is recessed as compared with other portions, so that the gap is formed.

A reason for providing a plurality of inlet ports, preferably the first and second inlet ports 12j and 12k that are opened in different directions, in the casing 12 as the inlet ports for sucking air into the casing 12 (that is, the fan housing space 120 will be described later.

In order to discharge the air sucked into the casing 12 through the first and second inlet ports 12j and 12k to the outside, the casing 12 includes an exhaust port 12p.

As shown in FIG. 2, in the first embodiment, the exhaust port 12p is provided on the right side surface 12c of the casing 12. In other words, the exhaust port 12p is provided on the side surface of the plateau-shaped raised portion 12d. Note that a guard frame 12q is provided at the exhaust port 12p in order to suppress entry of a foreign matter.

As shown in FIG. 6, the exhaust port 12p communicates with the heat sink housing space 12h and is disposed so as to face the air outlet port 32b of the fan 30.

A heat dissipation heat sink 40 is disposed between the exhaust port 12p and the fan 30, that is, in the heat sink housing space 12h located between the exhaust port 12p and the air outlet port 32b of the fan 30.

Figure 7:
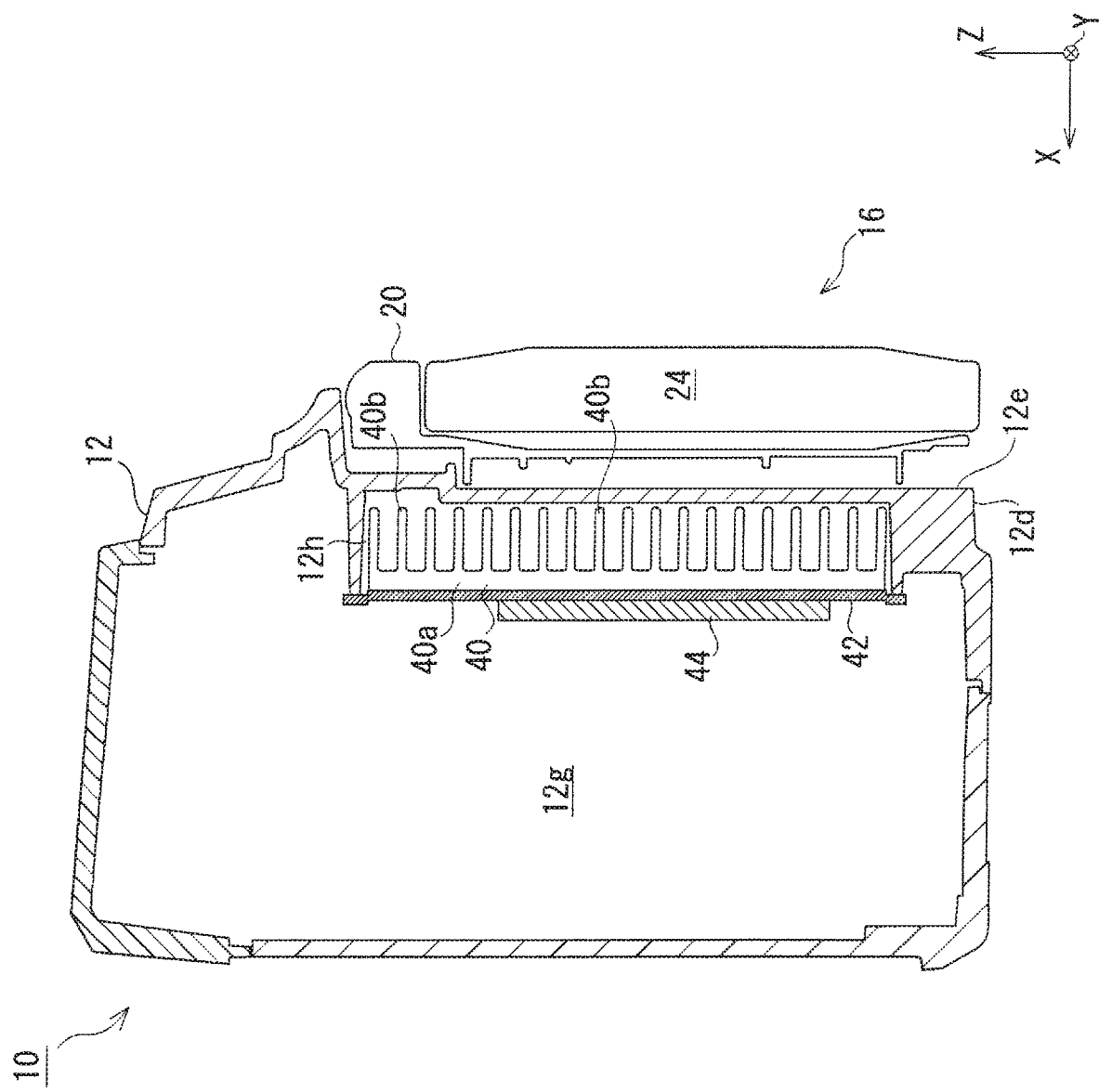
FIG. 7 is a side sectional view of the imaging apparatus.

FIG. 7 is a side sectional view of the imaging apparatus according to the present first embodiment.

In the first embodiment, as shown in FIG. 7, the heat dissipation heat sink 40 is made from a metal material, such as aluminum, and includes an attachment portion 40a and a plurality of heat dissipation fins 40b standing from the attachment portion 40a. As shown in FIG. 6, a plurality of the heat dissipation fins 40b are disposed in parallel in a facing direction of the exhaust port 12p and the air outlet port 32b of the fan 30, that is, in the left-right direction (Y-axis direction). In this manner, the air from the air outlet port 32b toward the exhaust port 12p can advance straight between a plurality of the heat dissipation fins 40b. In this manner, channel resistance is reduced, and a rotational speed of the fan 30 can be kept low, that is, the noise generated from the fan 30 can be kept down.

As shown in FIGS. 6 and 7, in the first embodiment, the attachment portion 40a of the heat dissipation heat sink 40 is attached to a partition wall 42 that separates the main space 12g and the heat sink housing space 12h. The partition wall 42 is made from a metal material, such as aluminum.

Further, the partition wall 42 separates the main space 12g and the fan housing space 12f.

An endothermic heat sink 44 that is disposed in the main space 12g and absorbs heat in the main space 12g is attached to the partition wall 42. The endothermic heat sink 44 is made from a metal material, such as aluminum. In the first embodiment, as shown in FIG. 6, the endothermic heat sink 44 is in contact with a moving image processing chip (processor) 52 that is mounted on a circuit board 50 and processes moving images. That is, the endothermic heat sink 44 is directly and thermally connected to the moving image processing chip 52. Further, the endothermic heat sink 44 is indirectly and thermally connected to the image sensor 54 for capturing images and moving images and other electronic components via the air in the main space 12g. Note that the image sensor 54 and the endothermic heat sink 44 may be directly connected (in contact). That is, an electronic component that generates high-temperature heat during high-load processing is preferably directly connected to (in contact with) the endothermic heat sink 44.

Note that at least two of the heat dissipation heat sink 40, the partition wall 42, and the endothermic heat sink 44 may be configured as one component. In this manner, the heat transfer efficiency from the endothermic heat sink 44 to the heat dissipation heat sink 40 can be improved.

Up to this point, the configuration related to heat dissipation of the imaging apparatus 10 has been described. From here, a method of heat dissipation will be described. Note that the method of heat dissipation will be described with reference also to FIG. 8, which is a schematic left rear perspective view of the imaging apparatus 10 showing a constituent related to heat dissipation of the imaging apparatus 10.

For example, when high-load processing, such as long-time shooting of images and videos and compression processing of high-resolution moving images, continues, electronic components housed in the main space 12g of the casing 12, such as the image sensor 54, the moving image processing chip 52, and the circuit board 50, generate heat. Part of the heat in the main space 12g generated as described above is dissipated to the outside through the casing 12, and the rest is absorbed by the endothermic heat sink 44.

The heat absorbed by the endothermic heat sink 44 is transmitted to the heat dissipation heat sink 40 through the partition wall 42.

On the other hand, when the high-load processing continues and the temperature in the main space 12g exceeds a predetermined temperature (for example, when a detected temperature of a temperature sensor (not shown) that detects a temperature in the casing 12 exceeds the predetermined temperature), the impeller 34 of the fan 30 rotates. Note that the rotational speed of the impeller 34 may be adjusted based on a temperature change in the casing 12. Further, the impeller 34 of the fan 30 may be rotated by operation by the user. Furthermore, the impeller 34 of the fan 30 may start to rotate when predetermined high-load processing, such as a moving image compression processing, is started. Furthermore, when a start switch of the imaging apparatus 10 is turned on, the impeller 34 of the fan 30 may start to rotate.

Figure 8:
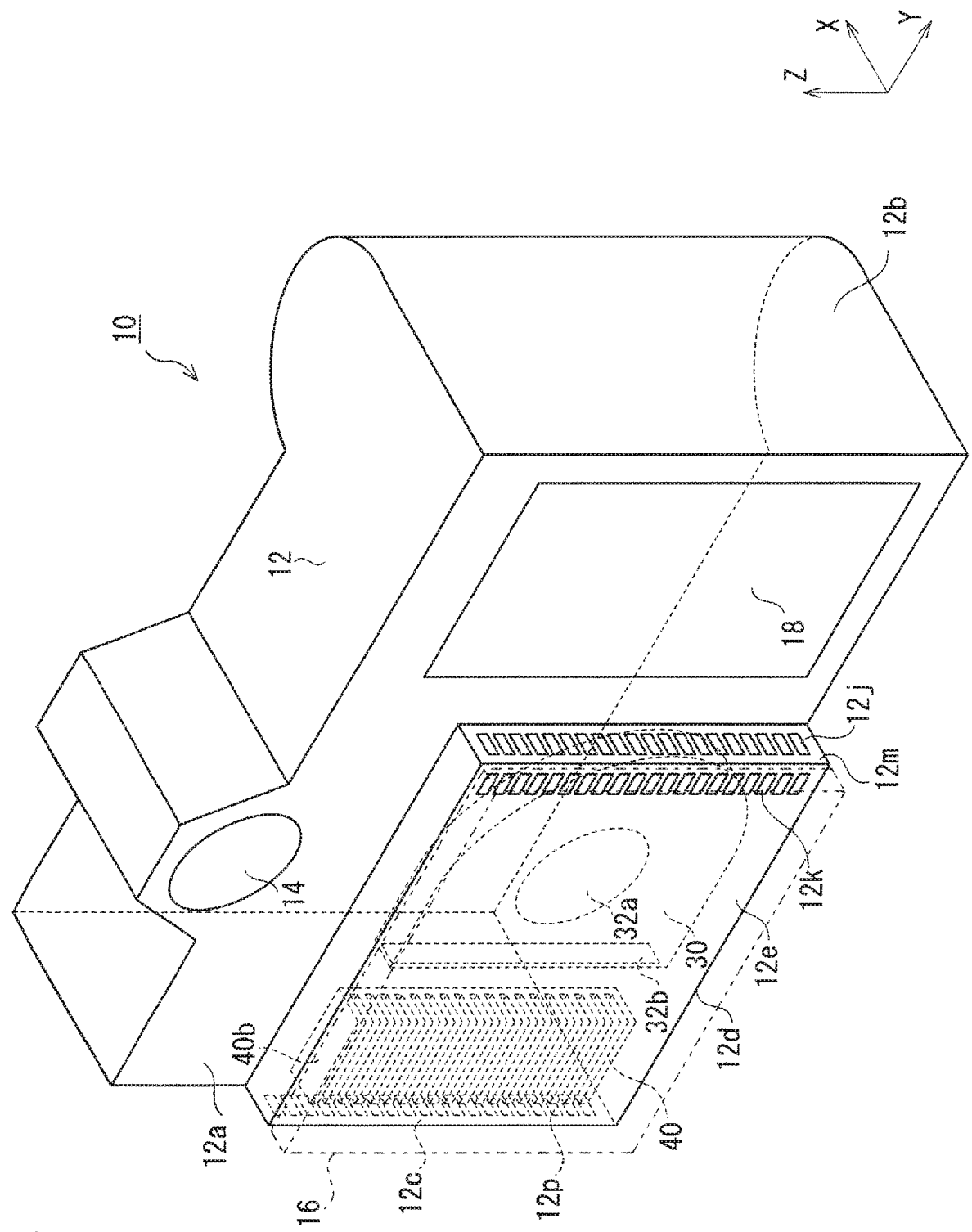
FIG. 8 is a schematic left rear perspective view of the imaging apparatus.

When the impeller 34 of the fan 30 rotates, air (outside air) is sucked into the casing 12 through the first and second inlet ports 12j and 12k, as shown in FIGS. 6 and 8. In this manner, as shown in FIG. 6, an air flow F1 passing through the first inlet port 12j and an air flow F2 (or F3) passing through the second inlet port 12k are generated.

Note that, regarding the second inlet port 12k, the air flow F2 is a flow generated when the display panel unit 16 is located at the housed position, and the air flow F3 is a flow generated when the display panel unit 16 is in a state of being rotated from the housed position (unhoused state). In a case where the display panel unit 16 is located at the housed position, the second inlet port 12k is covered by the display panel unit 16. For this reason, a flow rate of the air flow F2 in this case is smaller than a flow rate of the air flow F3.

The air flow F1 that passes through the first inlet port 12j and the air flow F2 (or F3) that passes through the second inlet port 12k merge in the casing 12, that is, in the fan housing space 12f. Then, the air is taken into the fan 30 housed in the fan housing space 12f. Specifically, air is taken into the fan case 32 of the fan 30 through the air intake ports 32a.

The air taken into the fan case 32 of the fan 30 is blown out by the rotating impeller 34 from the air outlet port 32b toward the exhaust port 12p.

Air blown out from the fan 30 (the air flow F4) passes between a plurality of the heat dissipation fins 40b of the heat dissipation heat sink 40 and travels toward the exhaust port 12p. Air passing between a plurality of the heat dissipation fins 40b takes heat from the heat dissipation fins 40b and holds the heat, and reaches the outside of the casing 12 through the exhaust port 12p.

The fan 30 generates an air flow that sequentially passes through the first and second inlet ports 12j and 12k, the fan 30, the heat dissipation heat sink 40, and the exhaust port 12p as described above, so that heat transferred from an electronic component in the casing 12 to the heat dissipation heat sink 40 can be forcibly discharged to the outside. As a result, the imaging apparatus 10 can efficiently dissipate heat generated during high-load processing, such as shooting high-quality moving images, that is, can have high heat dissipation performance.

Further, as schematically shown in FIG. 8, since the first and second inlet ports 12j and 12k are opened in different directions, a larger amount of air can be more reliably sucked into the casing 12 in a state where the designability of the imaging apparatus 10 is maintained.

Specifically, when air is sucked by only one suction port that opens in one direction in contrast to the above, the opening size of the suction port needs to be made large in order to ensure a sufficient suction amount. As a result, the designability of the imaging apparatus 10 may be impaired. Further, in a case where the suction port for which the opening size is made large is provided on the side surface of the raised portion like the first suction port 12j of the present embodiment, the height of the raised portion is increased as the opening size is made larger. There is a possibility that the designability of the imaging apparatus 10 is further impaired by the raised portion having a large height. Furthermore, there is a possibility that a hand of the user holding the imaging apparatus 10 (for example, the thumb of the right hand) blocks the only one suction port at least partially, and a sufficient amount of air necessary for heat dissipation cannot be sucked into the casing 12.

In view of the above, by providing the casing 12 with a plurality of inlet ports, preferably the first and second inlet ports 12j and 12k that are opened in different directions, that possibility that the suction port is blocked by the user's hand and air cannot be sucked into the casing is reduced. Further, at the same time, the deterioration in the designability of the imaging apparatus 10 caused by the large opening size of the suction port is suppressed.

Note that, since the exhaust port 12p is provided on the right side surface 12c, it is conceivable that an inlet port that opens toward the left of the casing 12 is provided on the left side surface 12b of the casing 12. However, since the left side surface 12b of the casing 12 is a portion where the user holds the casing 12 with the right hand, if an inlet port is provided on the left side surface 12b, the inlet port may be blocked by the user's right hand. Further, if an inlet port is provided on the left side surface 12b, a duct for guiding the air sucked by the inlet port to the fan 30 is required. However, since the operation unit 18 exists, specifically, since there is a substrate or the like on which a plurality of operation buttons 18a to 18e are mounted, space for providing a duct from the left side surface 12b to the fan 30 cannot be virtually secured in the casing 12.

Further, as schematically shown in FIG. 8, the heat dissipation heat sink 40 is disposed between the exhaust port 12p and the fan 30. That is, on the downstream side of the fan 30, the air flow takes heat away from the heat dissipation heat sink 40. Due to the arrangement of the heat dissipation heat sink 40 with respect to the fan 30, a distance in the casing 12 in which air in a high-temperature state by taking away heat flows can be shortened as compared with a case where the air flow takes heat away from the heat dissipation heat sink on the upstream side of the fan. In this manner, an amount of heat returning to the casing 12 from the flow of high-temperature air can be reduced, and the heat dissipation efficiency is improved.

In the first embodiment, as shown in FIG. 8, the first inlet port 12j is provided on the side surface 12m of the plateau-shaped raised portion 12d provided on the rear surface 12a of the casing 12, which is hardly covered by the user's hand. In this manner, the possibility that the first inlet port 12j is blocked by the user's hand is further reduced.

In the first embodiment, as shown in FIGS. 3 and 5, the entire second inlet port 12k can be hidden by the display panel unit 16. Therefore, in a case where the second inlet port 12k does not need to be used substantially, that is, in a case where the processing load is low and the heat generation amount in the casing 12 is small, the display panel unit 16 can cover and hide the second inlet port 12k. As a result, the deterioration in the designability of the imaging apparatus 10 due to the second inlet port 12k can be suppressed. Note that, in a case where the processing load is high, the user may be prompted to rotate the display panel unit 16 to expose the second inlet port 12k by, for example, a comment displayed on the display panel 24.

In the first embodiment, the exhaust port 12p opens toward the right of the casing 12 in the front view, that is, provided on the right side surface 12c of the casing 12. In this manner, the high-temperature air exhausted from the exhaust port 12p is suppressed from hitting the user's hand. In contrast, in a case where the exhaust port opens toward the left of the casing (is provided on the left side surface of the casing 12), the high-temperature air exhausted from the exhaust port hits the user's right hand and the user may feel uncomfortable.

In the first embodiment, the fan 30 is a sirocco fan that can blow out air which is highly rectilinear. Further, as shown in FIG. 6, the air outlet port 32b of the fan 30 and the exhaust port 12p of the casing 12 face each other. Then, a plurality of the heat dissipation fins 40b of the heat dissipation heat sink 40 are arranged in parallel to the facing direction of the exhaust port 12p and the air blowing port 32b. In this manner, the flow of air blown out from the fan 30 can efficiently cool the heat dissipation fins 40b while keeping the channel resistance low. As a result, the rotational speed of the fan 30 can be kept low, and noise from the fan 30 can be reduced.

As described above, according to the first embodiment, the heat dissipation performance of the imaging apparatus can be improved.

Second Embodiment

A second embodiment is substantially the same as the first embodiment described above except that the first and second inlet ports are different in positions on the casing. Therefore, the second embodiment will be described focusing on the difference.

Figure 9:
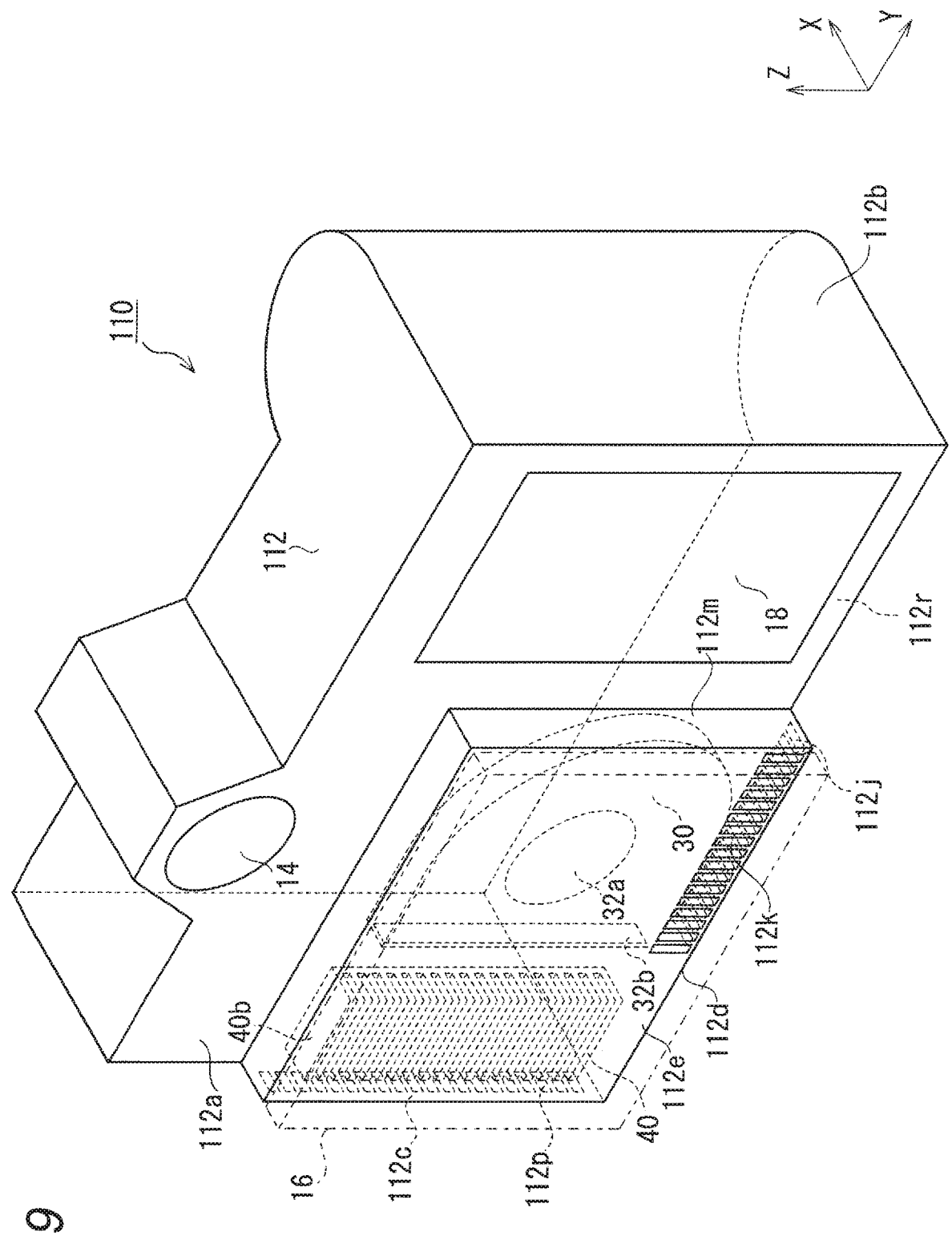
FIG. 9 is a schematic left rear perspective view of the imaging apparatus according to a second embodiment of the present disclosure.

FIG. 9 is a schematic left rear perspective view of the imaging apparatus according to the second embodiment of the present disclosure.

As shown in FIG. 9, a casing 112 of an imaging apparatus 110 according to the second embodiment includes a raised portion 112d formed by raising of a portion of the rear surface 112a as similar to the casing 12 of the imaging apparatus 10 according to the first embodiment described above shown schematically in FIG. 8. The raised portion 112d is plateau-shaped and includes a flat top surface 112e. The top surface 112e is covered with the display panel unit 16 in a state of being located at the housed position, similarly to the top surface 12e of the raised portion 12d of the first embodiment.

In the second embodiment, unlike the first embodiment described above, a first inlet port 112j is not provided on a side surface 112m on the operation unit 18 side of the casing 112 in the raised portion 112d. Instead, the first inlet port 112j is provided on a lower side surface of the raised portion 112d, that is, a lower surface 112r of the casing 112. Further, a second inlet port 112k is provided on the top surface 112e of the raised portion 112d so as to be adjacent to the first inlet port 112j. The second inlet port 112k is covered by the display panel unit 16 located at the housed position.

Air sucked into the casing 112 through the first and second inlet ports 112j and 112k is taken into the fan 30 through the air intake port 32a, and then blown out from the air outlet port 32b of the fan 30 to cool the heat dissipation heat sink 40. Then, the high-temperature air that has cooled the heat dissipation heat sink 40 is discharged to the outside of the casing 112 through an exhaust port 112p provided on a right side surface 112c.

The second embodiment can also improve the heat dissipation performance of the imaging apparatus, similarly to the first embodiment described above.

Third Embodiment

In the case of the above-described first embodiment, as schematically shown in FIG. 8, the casing 12 of the imaging apparatus 10 includes the raised portion 12d on the rear surface 12a. The raised portion 12d is provided with first and second inlet ports 12j and 12k. However, the casing of the imaging apparatus according to a third embodiment does not include a raised portion. Therefore, the third embodiment will be described focusing on the rear surface of the casing that is different.

Figure 10:
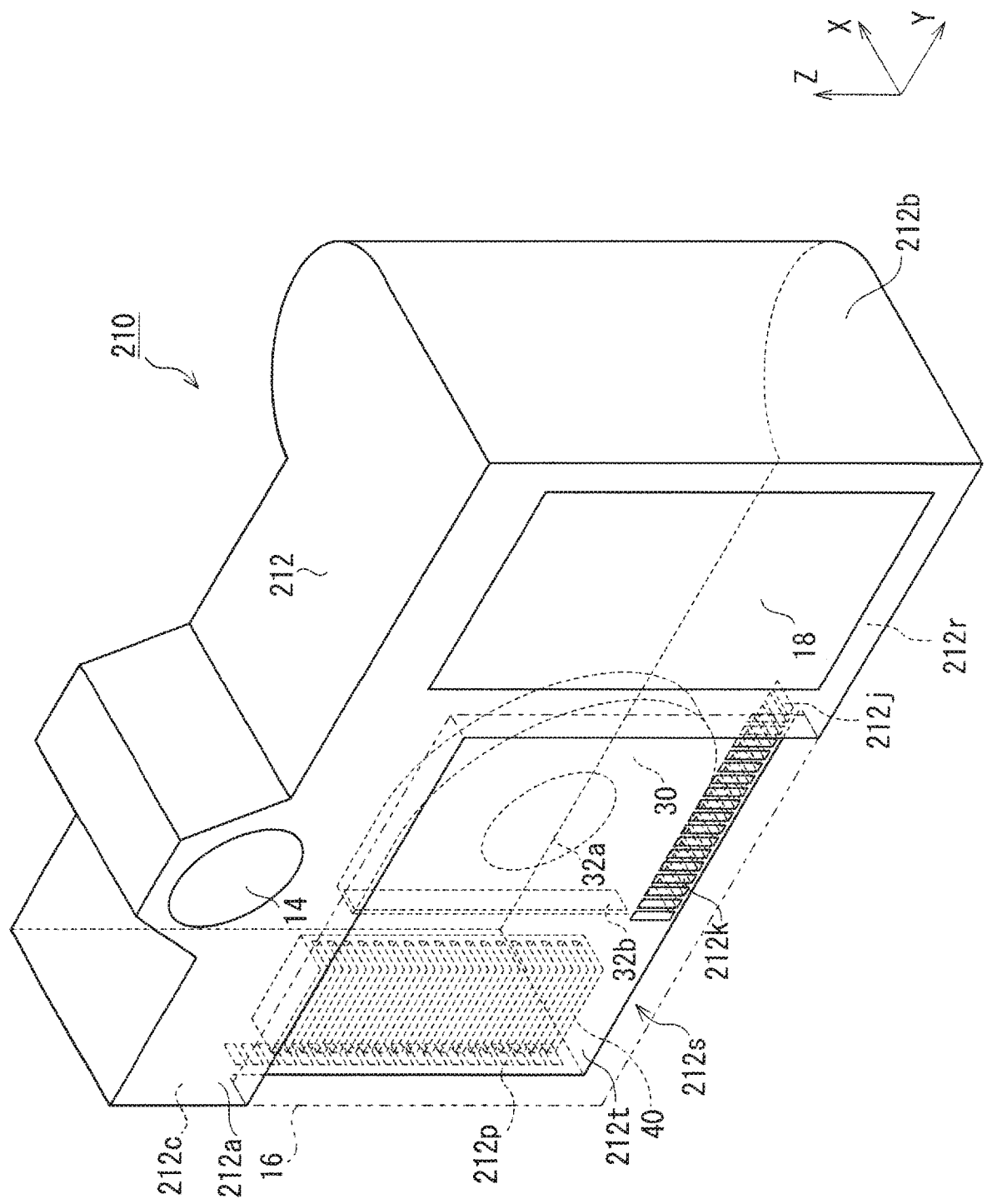
FIG. 10 is a schematic left rear perspective view of the imaging apparatus according to a third embodiment of the present disclosure.

FIG. 10 is a schematic left rear perspective view of the imaging apparatus according to the third embodiment of the present disclosure.

As shown in FIG. 10, a rear surface 212a of a casing 212 of an imaging apparatus 210 according to the third embodiment includes a depressed portion 212s formed by depression of a portion adjacent to the operation unit 18. The depressed portion 212s includes a flat bottom surface 212t. The display panel unit 16 is housed in the depressed portion 212s, and the bottom surface 212t is covered by the display panel unit 16 in the housed state.

In the third embodiment, a first inlet port 212j is provided on a lower surface 212r of the casing 212. Further, a second inlet port 212k is provided on the bottom surface 212t of the depressed portion 212s so as to be adjacent to the first inlet port 212j. The second inlet port 212k is covered by the display panel unit 16 located at the housed position.

Air sucked into the casing 212 through the first and second inlet ports 212j and 212k is taken into the fan 30 through the air intake port 32a, and then blown out from the air outlet port 32b of the fan 30 to cool the heat dissipation heat sink 40. Then, the high-temperature air that has cooled the heat dissipation heat sink 40 is discharged to the outside of the casing 212 through an exhaust port 212p provided on a right side surface 212c.

The third embodiment can also improve the heat dissipation performance of the imaging apparatus, similarly to the first embodiment described above.

Fourth Embodiment

In the case of the above-described first embodiment, as shown in FIGS. 2 and 4, the display panel unit 16 is provided on the casing 12 so as to be rotatable. As a result, the display panel 24 included in the display panel unit 16 is rotatably provided on the casing 12. However, in a fourth embodiment, the display panel is not rotatably provided on the casing. Therefore, the fourth embodiment will be described focusing on the rear surface of the casing that is different.

Figure 11:
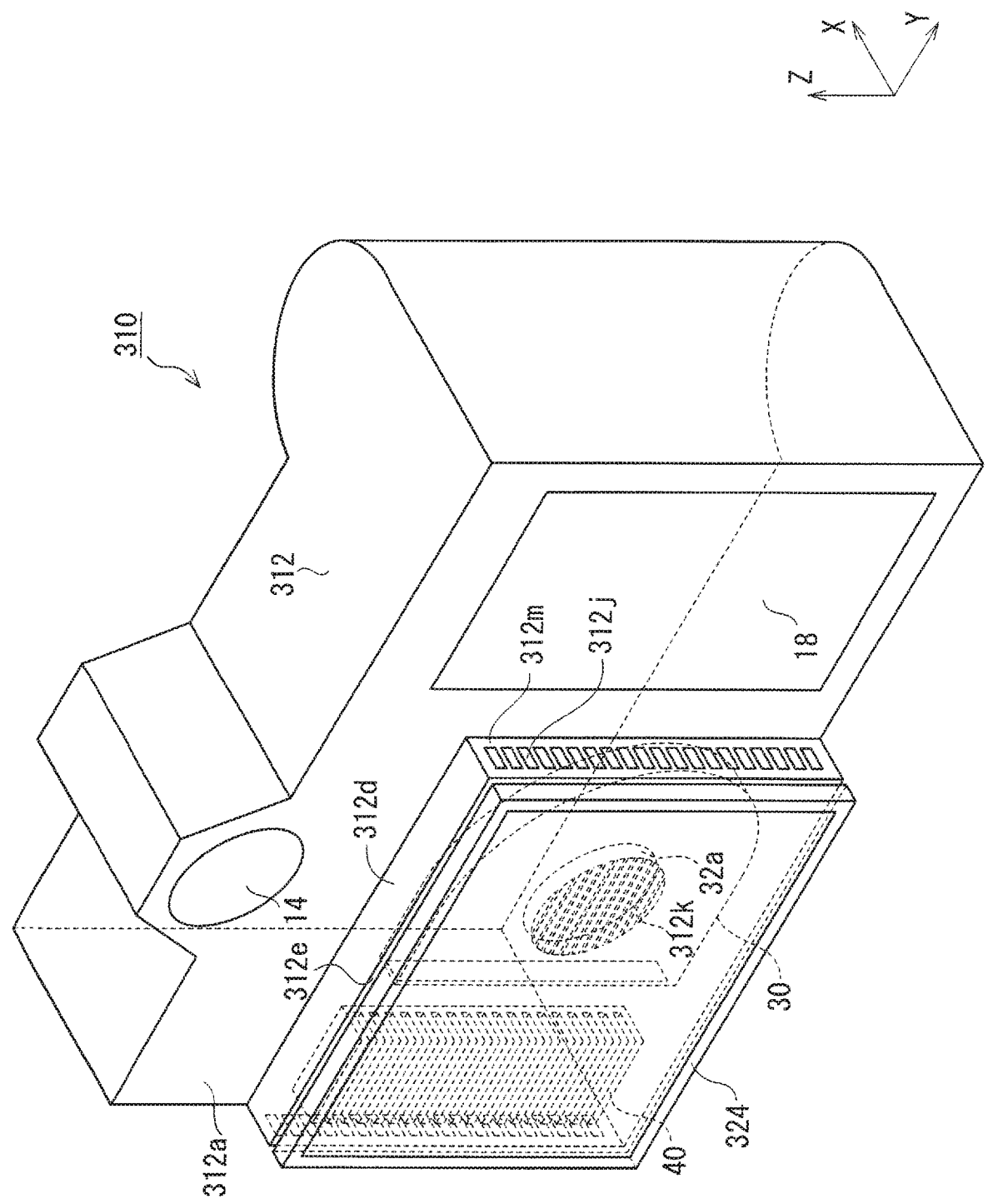
FIG. 11 is a schematic left rear perspective view of the imaging apparatus according to a fourth embodiment of the present disclosure.

FIG. 11 is a schematic left rear perspective view of the imaging apparatus according to the fourth embodiment of the present disclosure.

As shown in FIG. 11, a casing 312 of an imaging apparatus 310 according to the fourth embodiment includes a raised portion 312d formed by raising of a portion of a rear surface 312a as similar to the casing 12 of the imaging apparatus 10 according to the first embodiment described above shown schematically in FIG. 8. The raised portion 312d is plateau-shaped and includes a flat top surface 312e.

In the fourth embodiment, a first inlet port 312j is provided on a side surface 312m on the operation unit 18 side of the raised portion 312d. A second inlet port 312k is provided on the top surface 312e of the raised portion 312d.

A display panel 324 is provided on the top surface 312e of the raised portion 312d. In the fourth embodiment, the display panel 324 is provided on the top surface 312e of the raised portion 312d in a non-rotatable manner, that is, in a fixed state. Further, the display panel 324 forms a gap with the top surface 312e so that the second inlet port 312k provided on the top surface 312e of the raised portion 312d can suck air. In order to form such a gap, a spacer (not shown) is provided between the display panel 324 and the top surface 312e.

Note that, as shown in FIG. 11, the entire second inlet port 312k is covered by the display panel 324 in a fixed state when viewed in a facing direction (X-axis direction) between the display panel 324 and the top surface 312e of the raised portion 312d. For this reason, the second inlet port 312k is not involved in the designability of the imaging apparatus 310. Therefore, the area of the second inlet port 312k can be increased as much as possible. As a result, the efficiency of intake into the casing 312 is improved. In order to further improve the intake efficiency, the second inlet port 312k may be provided to face the air intake port 32a of the fan 30.

The fourth embodiment can also improve the heat dissipation performance of the imaging apparatus, similarly to the first embodiment described above.

Fifth Embodiment

A fifth embodiment is an improved form of the fourth embodiment described above. The difference from the above-described fourth embodiment is that the casing of the imaging apparatus of the fifth embodiment includes a depressed portion instead of a raised portion. Therefore, the fifth embodiment will be described focusing on this different point.

Figure 12:
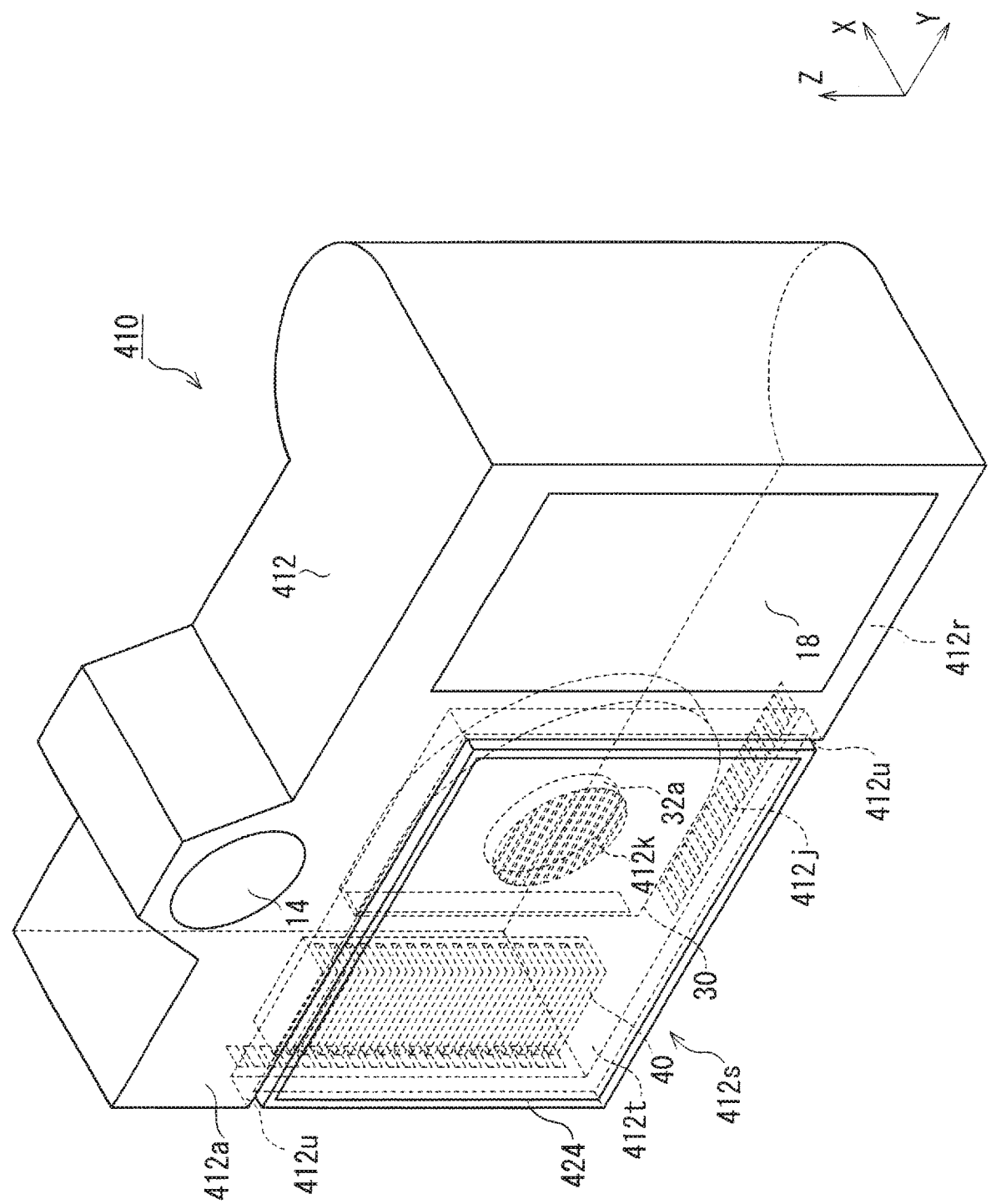
FIG. 12 is a schematic left rear perspective view of the imaging apparatus according to a fifth embodiment of the present disclosure.

FIG. 12 is a schematic left rear perspective view of the imaging apparatus according to the fifth embodiment of the present disclosure.

As shown in FIG. 12, a casing 412 of an imaging apparatus 410 according to the fifth embodiment includes a depressed portion 412s formed by depression of a portion of a rear surface 412a as similar to the casing 212 of the imaging apparatus 210 according to the third embodiment described above shown schematically in FIG. 10. The depressed portion 412s includes a flat bottom surface 412t.

In the fifth embodiment, a first inlet port 412j is provided on a lower surface 412r of the casing 412. Further, a second inlet port 412k is provided on the bottom surface 412t of the depressed portion 412s.

A display panel 424 is provided on the bottom surface 412t of the depressed portion 412s. In the present fifth embodiment, the display panel 424 is provided on the bottom surface 412t of the depressed portion 412s in a non-rotatable manner, that is, in a fixed state. Further, the display panel 424 forms a gap with the bottom surface 412t so that the second inlet port 412k provided on the bottom surface 412t of the depressed portion 412s can suck air. Further, the gap is also formed between a side surface 412u of the depressed portion 412s that connects the rear surface 412a and the bottom surface 412t of the casing 412 and the display panel 424. In order to form such a gap, a spacer (not shown) is provided between the display panel 424 and the bottom surface 412t.

Note that, as shown in FIG. 12, the entire second inlet port 412k is covered by the display panel 424 in a fixed state when viewed in a facing direction (X-axis direction) between the display panel 424 and the bottom surface 412t of the depressed portion 412s. For this reason, the second inlet port 412k is not involved in the designability of the imaging apparatus 410. Therefore, the area of the second inlet port 412k can be increased as much as possible. As a result, the efficiency of intake into the casing 412 is improved. In order to further improve the intake efficiency, the second inlet port 412k may be provided to face the air intake port 32a of the fan 30.

The fifth embodiment can also improve the heat dissipation performance of the imaging apparatus, similarly to the first embodiment described above.

Sixth Embodiment

A sixth embodiment is different from the first to fifth embodiments described above in that the second inlet port is not covered by the display panel unit or the display panel.

Figure 13:
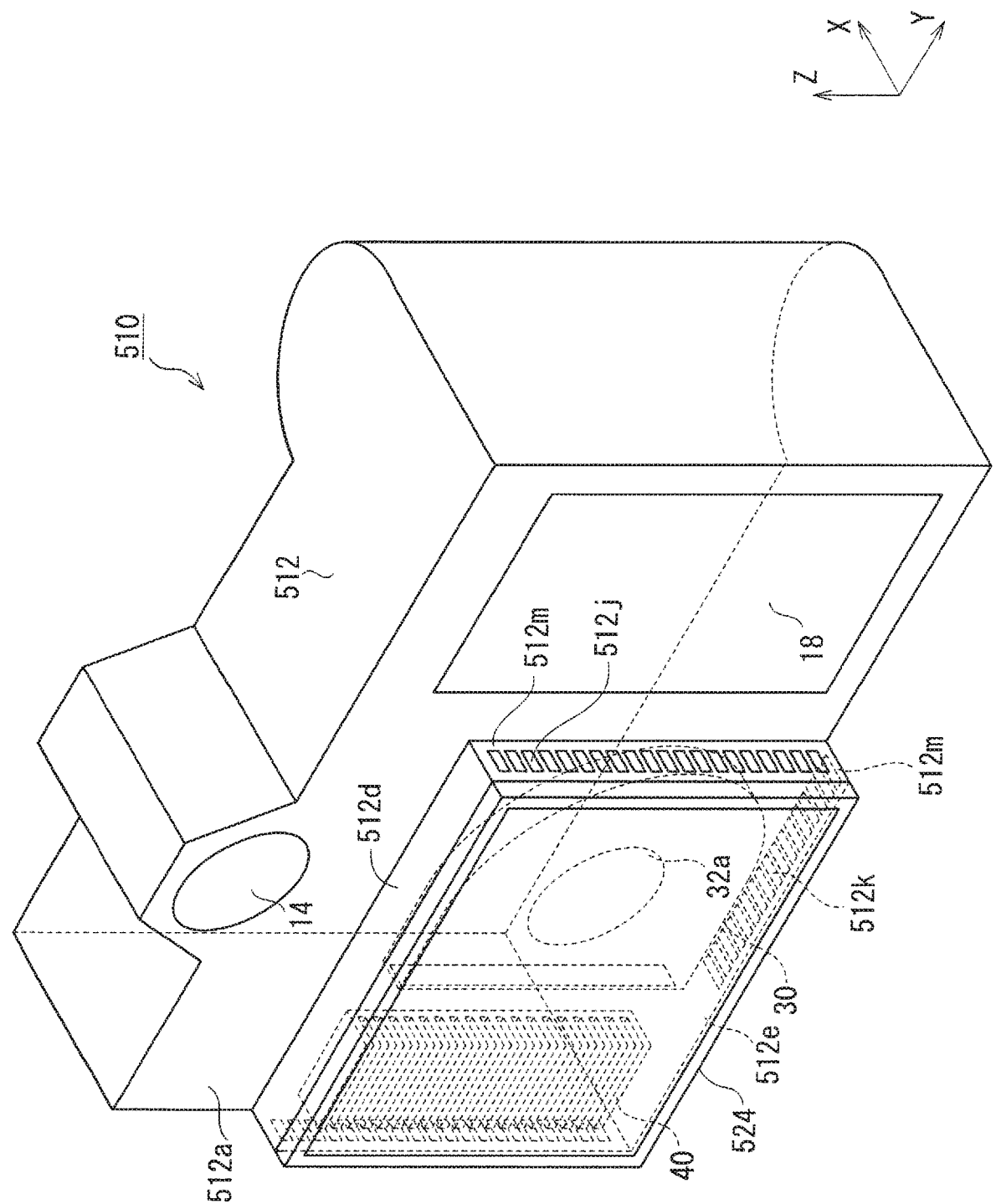
FIG. 13 is a schematic left rear perspective view of the imaging apparatus according to a sixth embodiment of the present disclosure.

FIG. 13 is a schematic left rear perspective view of the imaging apparatus according to the sixth embodiment of the present disclosure.

As shown in FIG. 13, a casing 512 of an imaging apparatus 510 according to the sixth embodiment includes a raised portion 512d formed by raising of a portion of a rear surface 512a as similar to the casing 12 of the imaging apparatus 10 according to the first embodiment described above shown schematically in FIG. 8. The raised portion 512d is plateau-shaped and includes a flat top surface 512e.

In the imaging apparatus 510 according to the sixth embodiment, first and second inlet ports 512j and 512k are provided on different ones of a plurality of side surfaces 512m of the raised portion 512d. A display panel 524 is fixed to the top surface 512e of the raised portion 512d. Note that, in the sixth embodiment, the display panel 524 is fixed to the top surface 512e without forming a gap with the top surface 512e.

As described above, since the first and second inlet ports 512j and 512k are provided on different ones of a plurality of the side surfaces 512m of the raised portion 512d, these inlet ports open in different directions. As a result, the possibility that both the first and second inlet ports 512j and 512k are simultaneously blocked by the user's hand is reduced.

Note that, in a case where the display panel is fixed to the bottom surface of the depressed portion instead of the top surface of the raised portion without forming a gap, the first and second inlet ports may be provided on different ones of a plurality of side surfaces of the depressed portion connecting the rear surface of the casing and the bottom surface of the depressed portion.

The sixth embodiment can also improve the heat dissipation performance of the imaging apparatus, similarly to the first embodiment described above.

Seventh Embodiment

A seventh embodiment is an improved form of the sixth embodiment described above. Therefore, the seventh embodiment will be described focusing on a difference from the sixth embodiment.

Figure 14:
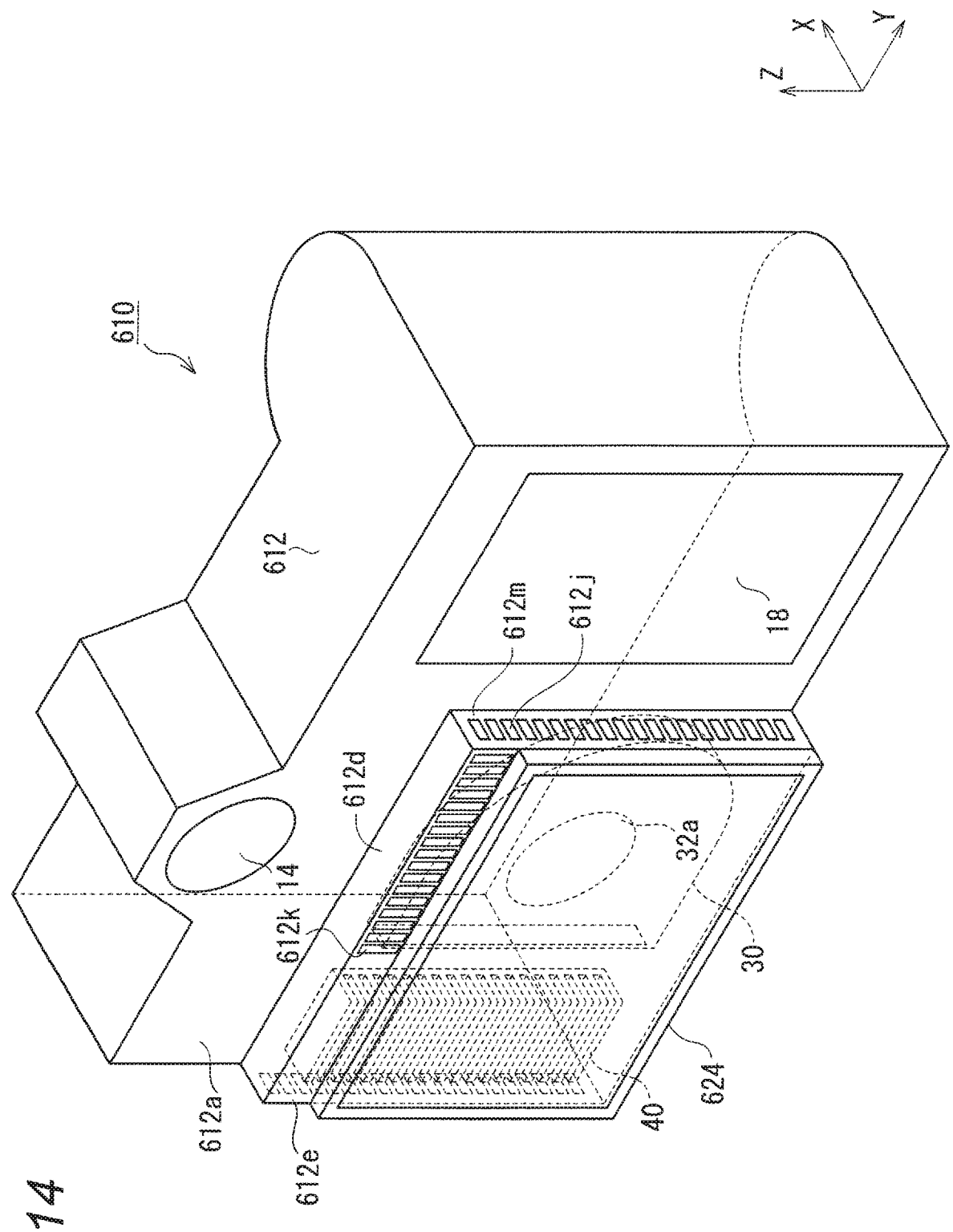
FIG. 14 is a schematic left rear perspective view of the imaging apparatus according to a seventh embodiment of the present disclosure.

FIG. 14 is a schematic left rear perspective view of the imaging apparatus according to the seventh embodiment of the present disclosure.

As shown in FIG. 14, a casing 612 of an imaging apparatus 610 according to the seventh embodiment includes a raised portion 612d formed by raising of a portion of a rear surface 612a as similar to the casing 12 of the imaging apparatus 10 according to the first embodiment described above shown schematically in FIG. 8. The raised portion 612d is plateau-shaped and includes a flat top surface 612e.

In the imaging apparatus 610 according to the seventh embodiment, a first inlet port 612j is provided on a side surface 612m of the raised portion 612d. A second inlet port 612k is provided on the top surface 612e of the raised portion 612d. Note that a display panel 624 is fixed to a portion, where the second inlet port 612k is not provided, of the top surface 612e of the raised portion 612d without forming a gap with the top surface 612e.

As described above, since the first inlet port 612j is provided on the side surface 612m of the raised portion 612d and the second inlet port 612k is provided on the top surface 612e of the raised portion 612d, these inlet ports open in different directions. As a result, the possibility that both the first and second inlet ports 612j and 612k are simultaneously blocked by the user's hand is reduced.

Note that, in a case where the display panel is fixed to the bottom surface of the depressed portion instead of the top surface of the raised portion without forming a gap, the second inlet port may be provided on the bottom surface of the depressed portion, and the display panel may be fixed to a portion of the bottom surface of the depressed portion where the second inlet port is not provided. The first inlet port may be provided on side surfaces of the depressed portion that connects the rear surface of the casing and the bottom surface of the depressed portion.

The imaging apparatus according to the present disclosure is described above with reference to a plurality of the first to seventh embodiments. However, the present disclosure is not limited to these embodiments.

For example, in the case of the first embodiment shown in FIGS. 1 to 8, the display panel unit 16 provided so as to be rotatable with respect to the casing 12 of the imaging apparatus 10 covers the top surface 12e of the raised portion 12d provided on the rear surface 12a of the casing 12 when in the housed state. In this manner, the entire second inlet port 12k provided on the top surface 12e is covered by the display panel unit 16 when viewed in the facing direction between the display panel unit 16 and the top surface 12e of the raised portion 12d. Further, in the case of the embodiment shown in FIG. 10, the display panel unit 16 provided so as to be rotatable with respect to the casing 212 of the imaging apparatus 210 covers the bottom surface 212t of the depressed portion 212s provided on the rear surface 212a of the casing 212 when in the housed state. In this manner, the entire second inlet port 212k provided on the bottom surface 212t is covered by the display panel unit 16 when viewed in the facing direction between the display panel unit 16 and the bottom surface 212t of the depressed portion 212s.

However, the position where the second inlet port that is entirely covered by the display panel unit is provided is not limited to the top surface of the raised portion or the bottom surface of the depressed portion. For example, the second inlet port may be provided on the rear surface of the casing without the raised portion and the depressed portion provided on the rear surface. In this case, the display panel unit that is rotatably provided on the rear surface of the casing and in the housed state may cover the entire second inlet port as viewed in the facing direction between the display panel unit in the housed state and the casing. Note that the first inlet port is provided in a portion of the casing that is not covered by the display panel unit in the housed state.

As described above, a plurality of embodiments are described as examples of the technique in the present disclosure. For that purpose, the accompanying drawings and the detailed description are provided.

Accordingly, the constituents described in the accompanying drawings and the detailed description may include not only a constituent essential for solving the problem, but also a constituent not essential for solving the problem in order to exemplify the technique. For this reason, the non-essential constituents are not to be immediately recognized as essential just because the non-essential constituents are described in the accompanying drawings and the detailed description.

Further, since the above-described embodiment is for exemplifying the technique in the present disclosure, various changes, substitutions, additions, omissions, and the like can be made within the scope of claims or a scope equivalent to the claims.

Note that, as several embodiments of the present disclosure are described, it is apparent to those skilled in the art that a further embodiment according to the present disclosure can be made by combining a certain embodiment with at least one of other embodiments in whole or in part.

For example, the first inlet port 12j according to the first embodiment may be provided as a third suction port on the side surface 112m of the raised portion 112d in the casing 112 of the imaging apparatus 110 according to the second embodiment shown in FIG. 9. In addition to the above (as a fourth suction port) or instead (in place of the first inlet port 12j), in the imaging apparatus 110 according to the second embodiment shown in FIG. 9, a suction port may be provided on an upper side surface (that is, the opposite side to the suction port 112j) of the raised portion 112d of the casing 112. Furthermore, in the imaging apparatus 110 according to the second embodiment shown in FIG. 9, the first inlet port 12j according to the first embodiment may be provided on the side surface 112m of the raised portion 112d instead of the inlet port 112k (in this case, the casing 112 includes two suction ports). As described above, the number of suction ports and a portion on the casing in which the suction port is provided can be variously changed as necessary. That is, the casing of the imaging apparatus according to the embodiment of the present disclosure includes a plurality of, three or more, inlet ports that open in different directions.

The present disclosure is applicable to an imaging apparatus.

What is claimed is:

1. An imaging apparatus comprising:
a casing having an inlet port and an exhaust port;
at least one heat source disposed in the casing and including at least an image sensor;
a fan that is disposed in the casing, takes in outside air through the inlet port, and blows out the taken-in outside air toward the exhaust port; and
an operation unit provided on a rear surface of the casing,
wherein the rear surface of the casing has a raised portion formed by raising of a portion adjacent to the operation unit,
the inlet port includes first and second inlet ports, and
at least the second inlet port of the first and second inlet ports is provided on the raised portion.

2. The imaging apparatus according to claim 1, further comprising a display panel provided on a top surface of the raised portion, wherein
the second inlet port is provided on the top surface of the raised portion, and
the display panel covers the second inlet port entirely when viewed in a facing direction between the top surface of the raised portion and the display panel.

3. The imaging apparatus according to claim 1, further comprising a display panel unit that includes a display panel and is rotatably provided on the casing, wherein
the second inlet port is provided on a top surface of the raised portion,
the display panel unit covers the top surface of the raised portion when in a housed state, and
the entire second inlet port is provided in a portion of the top surface of the raised portion that is covered by the display panel unit in the housed state when viewed in a facing direction between the display panel unit in the housed state and the top surface of the raised portion.

4. The imaging apparatus according to claim 1, further comprising a heat sink that is thermally connected to the heat source and disposed between the exhaust port and the fan.

5. The imaging apparatus according to claim 4, wherein
the fan is a sirocco fan that includes a fan case having an air intake port and an air outlet port, and an impeller that is housed in the fan case and rotates around a rotation center line extending in a front-rear direction of the casing,
the exhaust port and the air outlet port face each other, and the heat sink includes a plurality of heat dissipation fins arranged in parallel in a facing direction between the exhaust port and the air outlet port.

6. The imaging apparatus according to claim 1, wherein the exhaust port opens toward right of the casing in a front view of the casing.

7. An imaging apparatus comprising:
a casing having front, rear, top and bottom surfaces, and an inlet port and an exhaust port;
at least one heat source disposed in the casing and including at least an image sensor;
a fan that is disposed in the casing, takes in outside air through the inlet port, and blows out the taken-in outside air toward the exhaust port; and
an operation unit provided on the rear surface of the casing,
wherein the rear surface of the casing has a depressed portion formed by depression of a portion adjacent to the operation unit,
the inlet port includes first and second inlet ports,
the second inlet port is provided on the depressed portion, and
the first inlet port is provided on the bottom surface of the casing such that the first inlet port is adjacent to the second inlet port.

8. The imaging apparatus according to claim 7, further comprising a display panel provided on a bottom surface of the depressed portion, wherein
the second inlet port is provided on the bottom surface of the depressed portion, and
the display panel covers the second inlet port entirely when viewed in a facing direction between the bottom surface of the depressed portion and the display panel.

9. The imaging apparatus according to claim 7, further comprising a display panel unit that includes a display panel and is rotatably provided on the casing, wherein
the second inlet port is provided on the bottom surface of the depressed portion,
the display panel unit covers the bottom surface of the depressed portion when in a housed state, and
the entire second inlet port is provided in a portion of the bottom surface of the depressed portion that is covered by the display panel unit in the housed state when viewed in a facing direction between the display panel unit in the housed state and the bottom surface of the depressed portion.

10. The imaging apparatus according to claim 7, further comprising a heat sink that is thermally connected to the heat source and disposed between the exhaust port and the fan.

11. The imaging apparatus according to claim 10, wherein
the fan is a sirocco fan that includes a fan case having an air intake port and an air outlet port, and an impeller that is housed in the fan case and rotates around a rotation center line extending in a front-rear direction of the casing,
the exhaust port and the air outlet port face each other, and
the heat sink includes a plurality of heat dissipation fins arranged in parallel in a facing direction between the exhaust port and the air outlet port.

12. The imaging apparatus according to claim 7, wherein the exhaust port opens toward right of the casing in a front view of the casing.

* * * * *